(12) United States Patent
Gass

(10) Patent No.: US 11,054,476 B2
(45) Date of Patent: Jul. 6, 2021

(54) METHOD FOR MONITORING A STATUS OF A BATTERY, MONITORING DEVICE AND MOTOR VEHICLE

(71) Applicant: AUDI AG, Ingolstadt (DE)

(72) Inventor: Christoph Gass, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 217 days.

(21) Appl. No.: 16/437,333

(22) Filed: Jun. 11, 2019

(65) Prior Publication Data

US 2020/0033419 A1    Jan. 30, 2020

(30) Foreign Application Priority Data

Jul. 27, 2018    (DE) .......................... 10-2018-212545

(51) Int. Cl.
  *G01R 31/3842*    (2019.01)
  *B60L 58/12*    (2019.01)
(52) U.S. Cl.
  CPC .......... *G01R 31/3842* (2019.01); *B60L 58/12* (2019.02)
(58) Field of Classification Search
  CPC .............. G01R 31/3842; G01R 31/382; G01R 31/392; G01R 31/387; G01R 31/396; B60L 58/10; B60L 58/12
  (Continued)

(56) References Cited

U.S. PATENT DOCUMENTS 5,151,865 A * 9/1992 Blessing ................. B60L 58/12
                                                      702/63
5,841,284 A * 11/1998 Takahashi .......... G01R 31/3648
                                                      324/428

(Continued)

FOREIGN PATENT DOCUMENTS

AT          512745 A1    10/2013
DE    10 056 968 A1      5/2002
(Continued)

OTHER PUBLICATIONS

Stockley et al., (2014) Design and implementation of an open circuit voltage prediction mechanism for lithium-ion battery systems, Systems Science & Control Engineering: An Open Access Journal, 2:1,707-717 (Year: 2014).*

(Continued)

*Primary Examiner* — Patrick Assouad
*Assistant Examiner* — Sean Curtis
(74) *Attorney, Agent, or Firm* — Maier & Maier, PLLC

(57) ABSTRACT

A method for monitoring a status of a battery, wherein a battery current (I) is detected during a measurement cycle and the amount of charge (ΔQ) supplied to the battery and/or removed from the battery is determined as a function of the detected battery current (I). Furthermore, an estimated value (CS, CS0, CS1, CS2, CSn) for a capacity (C) of the battery before a certain relaxation time of the battery has elapsed, during which the battery is in the unloaded state after a load phase during which power is supplied to the battery and/or power is removed from the battery, is determined as a function of the determined amount of charge (ΔQ) and, as a function of the estimated value (CS, CS0, CS1, CS2, CSn), it is determined for the capacity (C) whether the capacity (C) of the battery is above a specifiable limit value (G).

11 Claims, 4 Drawing Sheets

(58) Field of Classification Search
USPC .................................................. 324/426–433
See application file for complete search history.

(56) References Cited

U.S. PATENT DOCUMENTS

| | | | | |
|---|---|---|---|---|
| 5,847,566 A * | 12/1998 | Marritt | ............... | G01R 31/3648 324/427 |
| 5,869,949 A * | 2/1999 | Nishikawa | .......... | H02J 7/00047 320/101 |
| 5,936,383 A * | 8/1999 | Ng | ...................... | G01R 31/389 320/132 |
| 6,054,861 A * | 4/2000 | Takahashi | .......... | G01R 31/3648 324/428 |
| 6,194,870 B1 * | 2/2001 | Kim | ................... | G01R 31/3648 320/134 |
| 6,300,763 B1 * | 10/2001 | Kwok | ................. | G01R 31/367 324/427 |
| 6,661,231 B1 * | 12/2003 | Arai | ................... | G01R 31/3648 324/426 |
| 6,892,148 B2 * | 5/2005 | Barsoukov | .......... | H01M 10/482 702/63 |
| 7,107,161 B2 * | 9/2006 | Ahmed | ................ | H01M 10/48 702/63 |
| 7,129,675 B2 * | 10/2006 | Brecht | ................ | H01M 10/44 320/137 |
| 7,589,491 B2 * | 9/2009 | Brecht | ................ | H02J 7/0091 320/104 |
| 7,633,265 B2 * | 12/2009 | Matsushima | ............ | H02J 7/00 320/134 |
| 7,676,335 B2 * | 3/2010 | Ahmed | ................ | H01M 10/48 702/63 |
| 7,683,580 B2 * | 3/2010 | Matsushima | ......... | H02J 7/0047 320/132 |
| 8,010,305 B2 * | 8/2011 | Ahmed | ................... | G06F 19/00 702/63 |
| 8,041,522 B2 * | 10/2011 | Plett | .................... | G01R 31/367 702/63 |
| 8,274,260 B2 * | 9/2012 | Kimura | .............. | H01M 10/482 320/132 |
| 8,274,291 B2 * | 9/2012 | Tsuchiya | ............. | G01R 31/367 324/426 |
| 8,378,638 B2 * | 2/2013 | Majima | .............. | G01R 31/3842 320/153 |
| 8,450,978 B2 * | 5/2013 | Barsukov | ............ | G01R 31/367 320/136 |
| 8,589,098 B2 * | 11/2013 | Ahmed | ................ | H01M 10/48 702/63 |
| 8,664,960 B2 * | 3/2014 | Tsuchiya | ............. | G01R 31/367 324/426 |
| 8,751,086 B2 * | 6/2014 | Li | ....................... | G01R 31/367 701/22 |
| 8,843,333 B2 * | 9/2014 | Tezuka | ................ | H01M 10/42 702/63 |
| 8,886,479 B2 * | 11/2014 | Matsumoto | ......... | G01R 31/396 702/63 |
| 9,081,068 B2 * | 7/2015 | Mattisson | .......... | G01R 31/3828 |
| 9,128,159 B2 * | 9/2015 | Mousseau | .............. | G06F 15/00 |
| 9,970,993 B1 * | 5/2018 | Mensah-Brown | ...... | B60L 58/10 |
| 10,035,425 B2 * | 7/2018 | Park | ...................... | B60L 58/12 |
| 10,322,634 B2 * | 6/2019 | Wang | ..................... | H01M 10/44 |
| 10,338,144 B2 * | 7/2019 | Sugiyama | ............ | G01R 31/382 |
| 10,371,754 B2 * | 8/2019 | Guo | ....................... | G01R 31/367 |
| 10,589,732 B2 * | 3/2020 | Ohkawa | ............... | B60W 10/08 |
| 10,634,724 B2 * | 4/2020 | Hashimoto | .......... | G01R 31/388 |
| 10,916,812 B2 * | 2/2021 | Chen | .................... | G01R 31/382 |
| 2005/0029988 A1 * | 2/2005 | Tran | ................... | G01R 31/3828 320/132 |
| 2005/0046389 A1 * | 3/2005 | Kim | .................... | G01R 31/3648 320/132 |
| 2009/0001992 A1 * | 1/2009 | Tsuchiya | .............. | G01R 31/367 324/426 |
| 2011/0300430 A1 * | 12/2011 | Usami | ................. | H01M 10/052 429/144 |
| 2012/0215472 A1 * | 8/2012 | Tezuka | ....................... | B60L 3/12 702/63 |
| 2013/0110428 A1 * | 5/2013 | Sun | .................... | G01R 31/3835 702/63 |
| 2014/0058595 A1 * | 2/2014 | Li | ....................... | G01R 31/3835 701/22 |
| 2014/0214347 A1 * | 7/2014 | Laskowsky | ......... | G01R 31/3842 702/63 |
| 2015/0234028 A1 * | 8/2015 | Lin | ..................... | G01R 31/3828 324/426 |
| 2015/0260798 A1 * | 9/2015 | Sugiyama | ............ | G01R 31/382 702/63 |
| 2016/0011269 A1 * | 1/2016 | Wang | ................. | G01R 31/3835 702/63 |
| 2017/0106760 A1 * | 4/2017 | Wang | ...................... | B60L 53/00 |
| 2017/0182906 A1 * | 6/2017 | Park | .................... | B60L 11/1857 |
| 2017/0242077 A1 * | 8/2017 | Guo | ........................ | H01M 10/48 |
| 2017/0244137 A1 * | 8/2017 | Guo | ...................... | G01R 31/382 |
| 2018/0050681 A1 * | 2/2018 | Ohkawa | ............... | G01R 31/3842 |
| 2018/0335479 A1 * | 11/2018 | Hashimoto | ........ | G01R 31/3842 |
| 2020/0033419 A1 * | 1/2020 | Gass | ........................ | B60L 58/12 |
| 2020/0047634 A1 * | 2/2020 | Akaishi | .................. | B60L 58/20 |

FOREIGN PATENT DOCUMENTS

| | | | | |
|---|---|---|---|---|
| DE | 10 2013 216 200 A1 | | 2/2014 | |
| DE | 10 2013 010 311 A1 | | 12/2014 | |
| KR | 20130060622 A | * | 6/2013 | ......... G01R 31/3828 |
| WO | 2007048367 A1 | | 5/2007 | |

OTHER PUBLICATIONS

Li et al., Fast Characterization Method for Modeling Battery Relaxation Voltage.www.mdpi.com/journal/batteries. Apr. 2016. (Year: 2016).*

Pei, Lei., Relaxation model of the open-circuit voltage for state-of-charge estimation in lithium-ion batteries. IET Electrical Systems in Transportation—IET Electr. Syst. Transp., 2013, vol. 3, Iss. 4, pp. 112-117 (Year: 2013).*

Search Report dated May 27, 2019, in corresponding German patent application No. 10 2018 212 545.7 including partial machine-generated English language translation; 13 pages.

* cited by examiner

METHOD FOR MONITORING A STATUS OF A BATTERY, MONITORING DEVICE AND MOTOR VEHICLE

FIELD

The disclosure relates to a method for monitoring a status of a battery, wherein during a measurement cycle, a battery current is detected and the amount of charge which was supplied to the battery and/or removed from the battery during the measuring cycle is determined as a function of the detected battery current, and a parameter of the battery (14) is determined as a function of the determined amount of charge. The invention also includes a monitoring device for monitoring a status of a battery and a motor vehicle.

BACKGROUND

For example, to prevent age-related malfunction of a battery and possibly critical situations resulting from it, it is necessary to regularly check the status of a battery, in particular its state of health, and to monitor it in this way. This applies in particular to high-voltage batteries in motor vehicles. For this purpose, various methods are known from the prior art. For example, DE 10 2013 010 311 A1 describes a method for determining the status of individual battery cells of a high-voltage battery in a vehicle, in which the current state of aging of the lithium-ion battery is determined. For this purpose measured variables of the individual cell monitoring which are present and are output to the bus system of the vehicle are used, in particular, for this purpose, the capacity or the capacity loss occurring in comparison to the status when new is calculated, taking into account the amount of electricity that has flowed and a first and a second state of charge. Here, the first state of charge is determined by comparing a detected first no-load voltage to voltage values stored in a look-up table, taking into account the temperature. The second state of charge is determined after charging or discharging the battery by comparing a detected second no-load voltage to voltage values stored in the lookup table, again taking the temperature into account. The no-load voltages, in turn, are only detected after a specifiable period of time has elapsed, the so-called relaxation time, during which the high-voltage battery is in an unloaded state. Only in this event, i. e., when the battery is completely relaxed, can the no-load voltages and variables calculated therefrom such as the capacity of the battery be accurately determined.

The problem with this is that the prerequisites for the most accurate possible determination of the capacity of a battery are only very rarely in place. In addition to the requirement that the open circuit voltage of the battery can be determined only after the relaxation time has elapsed, the state of charge swing, that is, the difference between the first and the second state of charge of the battery, must also be very large, that is, at least 60 percent in order to be able to determine the capacity with sufficient accuracy. In the vehicle, however, it is expected that a user will often plug in his/her vehicle for charging immediately when the vehicle is parked relatively empty. In such a situation, therefore, the open circuit voltage cannot be determined, since one would have to wait for the relaxation time of 15 minutes to several hours to elapse before the motor vehicle battery could be loaded by charging. Only a full or not heavily discharged vehicle is expected to be at rest long enough to be able to calculate the state of charge based on the open circuit voltage. In addition, in battery-electric vehicles with a long range, a state of charge swing of greater than 60 percent is usually rarely achieved. This has the consequence that the capacity of the battery cannot very often be determined with good accuracy, since the necessary prerequisites are rarely in place. However, in order to provide more safety, it would be desirable to be able to increase the number of successfully feasible diagnostics concerning the motor vehicle battery.

Furthermore, WO 2007/048367 A1 describes a method for determining a state of aging of a battery in which a plurality of parameters of the battery are determined and can be related to each other. For example, the capacity can be determined based on the relation of charge conversion and state of charge change.

In addition, DE 100 56 968 A1 describes a method for operating an electrical system of a motor vehicle, in which a status of a battery is determined and in the event that the determined state of the battery falls below a presettable limit value, at least one subsystem is supplied with a control signal, whereby the subsystem is transferred into a modified operating mode. The monitoring of the battery status is carried out by determining the battery charge or battery discharge. The battery state of charge can be determined directly at the battery, for example by measuring the open circuit voltage, which is proportional to the state of charge in the case of an unloaded battery, and by integrating the battery current during vehicle operation.

The problems described above occur also in these methods, so that the prerequisites for diagnostic options are rarely present here.

SUMMARY

The object of the present invention is therefore to provide a method for monitoring a status of a battery, a monitoring device and a motor vehicle will which make it possible to increase the number of successfully performed diagnoses relating to the battery.

This object is achieved by a method for monitoring a status of a battery, by a monitoring device and by a motor vehicle having the features according to the respective independent claims. Advantageous embodiments of the invention are the subject of the dependent claims, the description and the figures.

In a method according to the invention for monitoring a status of a battery, a battery current is detected during a measurement cycle and the amount of charge supplied to the battery and/or removed from the battery during the measurement cycle is determined as a function of the battery current detected. A parameter of the battery is determined as a function of the determined amount of charge. Furthermore, an estimated value for a capacity of the battery before a certain relaxation time of the battery has elapsed, during which the battery is in the unloaded state after a load phase, in particular during the measurement cycle, during which power is supplied to the battery and/or power is removed from the battery, is determined as a parameter and, as a function of the estimated value for the capacity, it is determined whether the capacity of the battery is above a specifiable limit value.

The invention is based on the finding that in order to determine whether or not the capacity of the battery is above a specifiable limit value, it is not necessary to provide an accurate determination of the capacity of the battery. In particular, it is sufficient to determine whether, for example, a determined value for the capacity of the battery within an error tolerance is above the specifiable limit value. As a result, it is advantageously very often still possible, even with relatively large uncertainties or measurement errors with respect to the determination of the capacity, to determine whether the capacity of the battery is above the limit value. This in turn makes it possible, by particularly simple methods, to determine an estimated value for the capacity of the battery, in particular, first and foremost by means of an estimation at least downwards, that is to say, for example, an estimate of the minimum capacity, for which, for example, it is not necessary to wait for the relaxation time of the battery to elapse and for which a certain state of charge swing is not necessarily required. Since advantageously there is no longer a need to wait for the exact relaxation time of the battery in order to be able to make a statement as to whether the capacity of the battery is above a specifiable limit, the frequency of diagnosis can be significantly increased, even if not every estimated value, for example due to too large an error tolerance, will lead to a successfully feasible diagnosis, i. e. to a diagnosis result. In particular, the method according to the invention or its embodiments can be used in addition to conventional diagnostic methods, so that precisely if not every execution of the method leads to a successful diagnosis due to excessive measurement inaccuracies, at least overall the frequency of the diagnoses can be significantly increased. Especially with regard to the assessment of the state of health of the battery, it is only necessary to determine whether the battery is in a healthy state or in a possibly critical state, which in turn can be measured by means of a threshold value. Likewise, the exact knowledge of the capacity of the battery is irrelevant for this, it is only relevant to know whether the capacity of the battery, based on which the state of health can be measured, is above a predetermined limit or not. In order to increase the number of successful diagnoses, it is sufficient to determine that the capacity of the battery is above the specifiable limit value, for example a parameterized minimum limit, for which, however, the capacity of the battery does not have to be calculated accurately in every instance. Thus, it is possible to resort to particularly simple and advantageous calculation methods which can be used in much more frequent situations, since, in order to carry out these capacity determination methods, it is not necessary to wait for the determined relaxation time of the battery to elapse at the end of the measurement cycle.

The battery may generally comprise at least one battery cell, but preferably comprises a plurality of battery cells. Preferably, the battery is designed as a high-voltage battery for a motor vehicle, in particular for an electric vehicle or hybrid vehicle. The relaxation time of the battery represents the time after a load phase of the battery during which the battery is in the unloaded state, in particular until the battery has completely switched to the resting phase. During the relaxation time of the battery, the no-load voltage of the battery, that is, the voltage of the battery when no load is connected, changes until the relaxation time has elapsed. Only then will there be no change in the no-load voltage of the battery. In other words, the relaxation time of the battery is defined as the duration until there is no change in the no-load voltage of the battery, and thus the battery is in the relaxed state. This relaxation time may be a function of various parameters and influencing variables, such as the type of battery, the temperature, the nature of the previous load, and so forth. The status of the battery, in particular its state of health, is monitored by determining whether the capacity of the battery is above the specifiable limit value or not. If, for example, it is determined that the capacity of the battery is above the specifiable limit value, then the status of the battery is considered to be in good order. If, instead, it is determined that the capacity of the battery is not above the specifiable limit value, in particular is below it, then the state of the battery is classified as not in good order and as a result, for example, a corresponding error entry can be written to the error memory and/or a warning message may be issued to the driver by the motor vehicle.

Preferably, the method according to the invention or one of its embodiments can be carried out repeatedly, in particular as often as the situation permits, whereby the number of successful diagnoses can be maximized.

In a particularly simple and advantageous embodiment of the invention, the amount of charge supplied to the battery and/or removed from the battery during the measurement cycle represents the minimum capacity estimate. The amount of charge can be determined easily based on the detected battery current. For example, to check if the battery still has at least 50 percent of its capacity when new, and if the capacity of the battery when new is, for example, 50 ampere hours, it is necessary to check whether the current total capacity of the battery is still 25 ampere hours. If, for example, it is determined during driving based on the detected battery current that already more than 25 ampere hours of charge were removed from the battery, it is also clear at the same time that the capacity of the battery must be at least 25 ampere hours and thus therefore the capacity of the battery must be above the specifiable limit value, namely the 25 ampere hours, regardless of exactly how large the total capacity of the battery is. The same can be found when charging.

For example, if, based on the charging current, it is determined that the battery has taken up more than 25 ampere hours of charge while charging, it can be determined at the same time that the capacity of the battery is more than 25 ampere hours and thus again is above the specifiable limit value. In both cases, a successful diagnosis can thus be carried out in a particularly simple manner, without the need to determine the capacity of the battery precisely. Such a diagnosis can therefore be carried out at any time during the driving operation as well as at each loading, without the need for certain prerequisites such as the expiration of the relaxation time or the like to be in place.

For example, if during driving or charging, an effective charge throughput, that is, the total amount of charge eventually removed from or supplied to the battery, of 25 ampere hours is not reached, the diagnosis remains unfinished, because then no statement can be made about whether the capacity of the battery is above the specifiable limit value or not. Nevertheless, overall, the number of successful diagnoses can be increased, especially if this method is used in addition to conventional methods. Since the battery current is usually monitored anyway and used for capacity determination, this method can advantageously be implemented without any additional effort in a simple manner. Also, this method provides significantly faster results because even if the exact capacity value has not yet been calculated, a positive diagnosis result can be output immediately, for example, if it is determined during driving that now 25 ampere hours charge of the battery were removed at a stretch, that is without intermediate recharging by recuperation or an additional internal combustion engine, or when charging the battery more than 25 ampere hours of charge were supplied. It should again be explicitly pointed out that the variables mentioned here, in particular the 25 ampere hours, are for illustrative purposes only. In general, therefore, any limit value for the minimum capacity of the battery can be specified as required, for example as an absolute value or as a percentage limit value based on the capacity of the battery when new.

Preferably, the amount of charge supplied to the battery and/or removed from the battery during the measurement cycle is determined by integration of the battery current over time. In particular, this integration also takes into account the sign of the battery current, so that this integration ultimately provides the effective amount of charge that was supplied to or removed from the battery during the integration period.

With such a determination of the amount of charge, as with any measuring method, measurement errors inevitably occur. Therefore, it is a particularly advantageous embodiment of the invention that a maximum measurement error for the determined amount of charge is determined as a function of an entire charge throughput during the measurement cycle, wherein the maximum measurement error is taken into account in the determination of the estimated value, in particular wherein the estimated value represents the determined amount of charge minus the maximum measurement error. Alternatively, this measurement error could also be taken into account in a corresponding manner by the specifiable limit value, which can then be selected to be larger, for example, by the maximum measurement error. By taking into account the maximum possible measurement error, it is always advantageously possible to ensure that no misdiagnoses are made even in the event of possibly large measurement errors. In the example described above, the estimated value represents the effective amount of charge supplied to the battery and/or removed from the battery. Since this amount of charge can be determined by the integration of the current, the only measurement error is the one that comes about by this integration of the current. In an extension of the determination method for determining the estimate of the minimum capacity, as will be described in more detail below, other error estimates than those concerning the integration of the current can be taken into account in this maximum measurement error. However, since all the methods described are based on an integration of the current for determining the amount of charge removed or supplied, it is particularly advantageous if at least the maximum measurement error for the determined amount of charge is taken into account in the determination of the estimated value or its comparison with the specifiable limit value.

For example, an error of 1 percent of gross charge throughput may be taken into account as a maximum error in the integration of the current. The gross charge throughput represents the charge throughput to which the battery is exposed during the measurement cycle, regardless of whether the battery is discharged or charged or partially discharged and then charged again. So, for example, during a measurement cycle of the battery initially an amount of charge of 10 ampere hours is removed and then 10 ampere hours are supplied, the gross charge throughput is 20 ampere hours while the net charge throughput or net charge amount is 0 in this case. The gross charge throughput is therefore always greater than or equal to the net amount of charge.

For illustration purposes, the error calculation of the integration of the current will now be demonstrated by way of example: In this example the total throughput of charge is 50 ampere hours from start to finish. As a result, with a linear error of 1 percent, the worst-case inaccuracy is 500 milliampere hours of the integration of the current. Based on a net charge difference from start to finish of 40 Ah the resulting inaccuracy from the current measurement is 0.5/40=1.25%. This can accurately determine the maximum or worst possible error the capacity calculation is subject to.

The higher the charge throughput, the more the net charge difference or the net charge amount must therefore exceed the required minimum threshold in order to be able to make a reliable statement. This can now be readily ensured in an advantageous manner by taking into account the maximum measurement error.

In a further advantageous embodiment of the invention, the estimated value is determined as the ratio of the determined amount of charge to the absolute value of the state of charge change of the battery. The state of charge of the battery is also referred to as State of Charge (SOC). By now setting the determined amount of charge in relation to this change in the state of charge of the battery, the capacity of the battery can be estimated even more accurately. For example, if during a measurement cycle 25 ampere hours of charge are removed from the battery and thereby the state of charge of the battery drops from 100 percent to 50 percent, it can be assumed, for example, that the capacity of the battery is about 50 ampere hours. In this way, advantageously, the capacity of the battery can also be estimated if only small amounts of charge are supplied to or removed from the battery, which as such would fall below the required capacity limit value. This makes it possible to carry out a possibly successful diagnosis even with smaller amounts of charge.

The initial and final states of charge of the battery are usually determined by measuring the open circuit voltage at the beginning and at the end of a measuring cycle. However, this has the disadvantages described at the outset, namely that the battery must be in a relaxed state in order to be able to determine the open circuit voltage of the battery as accurately as possible. However, these problems are advantageously remedied by the embodiments of the invention described below.

First, to determine the state of charge change, an initial state of charge of the battery at the beginning of the measurement cycle is determined as a function of a voltage measurement of the battery voltage while the battery is in the unloaded state. In particular, the battery is preferably not only in the unloaded state, but in the relaxed state, that is, in a state in which the no-load voltage of the battery does not change. The invention is based on the finding that a determination of the open circuit voltage at the beginning of a measurement cycle is very often readily possible in most cases. In other words, it is very common that a nearly fully charged battery is in a fully relaxed state before a subsequent load phase, for example, before a subsequent starting of a trip. For example, if a user charges his motor vehicle at home overnight, the battery is typically already charged a long time before the user starts to drive in the morning and has already fully transitioned to the relaxed state during that time. Thus, frequently, the determination of the initial state of charge of the battery can advantageously be made very accurately on the basis of the measurement of the open circuit voltage of the battery. In particular, the state of charge, specifically the initial state of charge, of the battery is determined based on the measured battery voltage by means of a look-up table. In this look-up table, the battery temperature is preferably taken into account, which is thus preferably also measured in the determination of the battery voltage.

It is now particularly advantageous, as provided according to a further exemplary embodiment of the invention, if for determining the state of charge change a final state of charge is determined at the end of the measuring cycle as a function of the detected battery current and as a function of a capacity value of the battery which was determined in a preceding measuring cycle. In other words, thus, the [determination of the] state of charge of the battery at the end of the measuring cycle is not also carried out via a voltage measurement, in particular an open circuit voltage measurement, of the battery, but instead is calculated on the basis of the battery current. This has the great advantage that at the end of the measuring cycle, it is no longer necessary to wait for the relaxation time of the battery to elapse. For example, if the battery is fully charged, that is, the initial state of charge is 100 percent, and then the battery is subjected to a load phase, the final state of charge can be calculated according to the following formula:

$$SOC_E = 1 - \int I(t)dt/C$$

Here, I(t) denotes the detected battery current over time, particularly during the load phase, C denotes the capacity of the battery, and $SOC_E$ denotes the final state of charge of the battery. Thus, to determine the final state of charge of the battery based on the current measurement, knowledge of the capacity of the battery is required. The previously determined estimated value for the capacity of the battery can now advantageously be used as an estimated value for this capacity. This estimated value for the capacity of the battery can be determined in any manner, for example, also according to known prior art methods, or, each time when a new capacity value is determined in accordance with the embodiment just described, this capacity value is stored and in the event of a new determination, this value is used as the previous capacity value. Thus, advantageously, the current final state of charge can be determined approximately based a previous capacity value based on the current measurement, and in turn ultimately the current estimated value for the capacity of the battery. This capacity can be determined, as already described above, namely as a ratio of the determined amount of charge to the absolute value of state of charge change of the battery, wherein the state of charge change again represents the difference, in particular the absolute value of the difference, between the initial state of charge and the final state of charge, and wherein the initial state of charge again is determined on the basis of the measurement of the open circuit voltage of the battery while the final state of charge, as just described, is determined on the basis of the detected battery current and a previously determined capacity value of the battery.

Here again, advantageously, a maximum measurement error can be taken into account. In particular, this error includes the above-described error of the integration of the current resulting in the determination of the amount of charge. Alternatively or additionally, however, other errors can also be taken into account. For example, a corresponding measurement error can also be assigned to the previously determined capacity value. In addition, provision may be made that determining the estimated value of the capacity of the battery on the basis of this described method is only permissible if the previously determined capacity value was determined not too long ago, that is to say before a definable period of time that is not so long, for example, a maximum of one month or a period of similar magnitude. Furthermore, the longer the time span following the determination of this previous capacity value, the greater the maximum measurement error can be assumed to be for this previously determined capacity value. Also, for example, for the determination of the initial state of charge on the basis of the measured open circuit voltage, a corresponding maximum possible measurement error can be assumed. This ultimately provides a maximum possible total error by which the determined estimated value of the capacity may deviate from the actual capacity of the battery. This maximum possible total error can now be taken into account advantageously in the diagnosis as well, especially when comparing the estimated value with the specifiable limit value. Thus, once again possible misdiagnoses can be excluded.

In a further advantageous embodiment of the invention, a plurality of second battery voltages are determined at the end of the measurement cycle in temporal succession while the battery is in the unloaded state, but does not necessarily have to be completely relaxed, wherein respective second final state of charge values are determined as a function of the second battery voltages, as a function of which second final state of charge values corresponding capacity values, in particular capacity estimates, are determined. In doing so, in the event that the capacity values increase over time and the temporally first capacity value is greater than the specifiable limit value, it is determined that the capacity of the battery is above the limit value. In the event that the capacity values, however, decrease over time and the temporally first capacity value is smaller than the specifiable limit value, it is determined that the capacity of the battery is below the limit value. For the further event that the capacity values increase over time and the temporally first capacity value is smaller than the specifiable limit value, or for the further event that the capacity values decrease over time and the temporally first capacity value is greater than the specifiable limit value, the capacity values are extrapolated over time and the estimated value is determined as a function of the extrapolation.

By means of this advantageous embodiment of the invention, the capacity of the battery, in particular its estimated value, can be calculated continuously during the relaxation, for example, by determining a plurality of capacity values temporally in succession. For example, if the calculated capacity is already above the minimum threshold at the beginning of the relaxation, that is, the specifiable limit value, and if in the course of relaxation the capacity continues to increase, it can also be stated with certainty in this case that the capacity of the battery is above the limit value. Even if the estimated capacity at the beginning of the relaxation is not yet above the limit value, but increases in the course of the relaxation and exceeds the limit value, it can also be immediately stated at this moment that the capacity of the battery is above this limit value. The same applies in the opposite event, in which the repeatedly determined capacity values of the battery or their estimated values decrease over time. If one of the determined capacity values then falls below the limit value or if the first of these capacity values is already below the limit value and the capacity continues to decrease, then it can also be stated with certainty in this situation that the capacity of the battery is also below the limit value. In addition, if it is not the first determined capacity estimates that are above the limit value in the event of increasing capacity values or below the limit value in the event of capacity values decreasing over time, in addition, advantageously also an extrapolation can be carried out in order to be able to make the earliest possible statement or diagnosis without having to wait for the relaxation time to completely elapse. If, for example, the first determined capacity estimate is above the limit value and the capacity values decrease during the relaxation, then this course can now be extrapolated over time and it can be determined on the basis of this extrapolation whether the limit value is presumably undershot or not. The same applies in the opposite event, if the temporally first determined capacity value is still below the limit value but the capacity values increase further over time during relaxation. Thus, advantageously, the capacity of the battery can now be determined on the basis of the integration of the current in relation to the state of charge swing, wherein the corresponding initial and final states of charge again are carried out on the basis of a corresponding measurement of the open circuit voltage of the battery. However, here, in order to determine the final state of charge of the battery, there is no waiting for the relaxation time to elapse, rather a plurality of successive "final states of charge" and resulting capacity estimates are already determined, on the basis of which it is determined whether the capacity of the battery is above or below the specifiable limit value. Again, the maximum possible error can be taken into account in the determination of the estimated value. This error, in turn, may incorporate the error in the integration of the current, as already described above, as well as other errors in determining the initial and the second final state of charge values of the battery.

Thus, advantageously various possibilities are provided to estimate the capacity of the battery and make a statement with certainty about whether the capacity of the battery is above a certain limit value without having to wait for the relaxation time of the battery to elapse after a load phase at the end of a measurement cycle. The described methods can advantageously also be combined with one another in any desired manner, in particular because they share many common method steps. In addition, the described determination methods can also be combined with conventional determination methods, so that advantageously overall the number of possible successful diagnoses can be significantly increased.

The invention also relates to a monitoring device for monitoring a status of a battery, wherein the monitoring device is adapted to detect a battery current during a measurement cycle and to determine the amount of charge supplied to the battery and/or removed from the battery during the measurement cycle as a function of the detected battery current and to determine a parameter of the battery as a function of the determined amount of charge. In this case, the monitoring device is configured in such a way that the monitoring device determines an estimated value for a capacity of the battery before a certain relaxation time of the battery has elapsed, during which the battery is in the unloaded state after a load phase during which power is supplied to the battery and/or power is removed from the battery, as a parameter, and, as a function of the estimated value, determines for the capacity whether a capacity of the battery is above a specifiable limit value.

In addition, the invention also relates to a motor vehicle with a monitoring device according to the invention. The invention also comprises the combinations of the features of the described embodiments.

The advantages mentioned for the method according to the invention and its embodiments also apply in the same way to the monitoring device according to the invention and the motor vehicle according to the invention. The invention also includes developments of the monitoring device according to the invention and the motor vehicle according to the invention, which have features as have already been described in connection with the further developments of the method according to the invention. For this reason, the corresponding further developments of the motor vehicle according to the invention and of the monitoring device according to the invention will not be described again here.

BRIEF DESCRIPTION OF THE DRAWINGS

Exemplary embodiments of the invention are described below. In the drawings.

DETAILED DESCRIPTION

Figure 1:
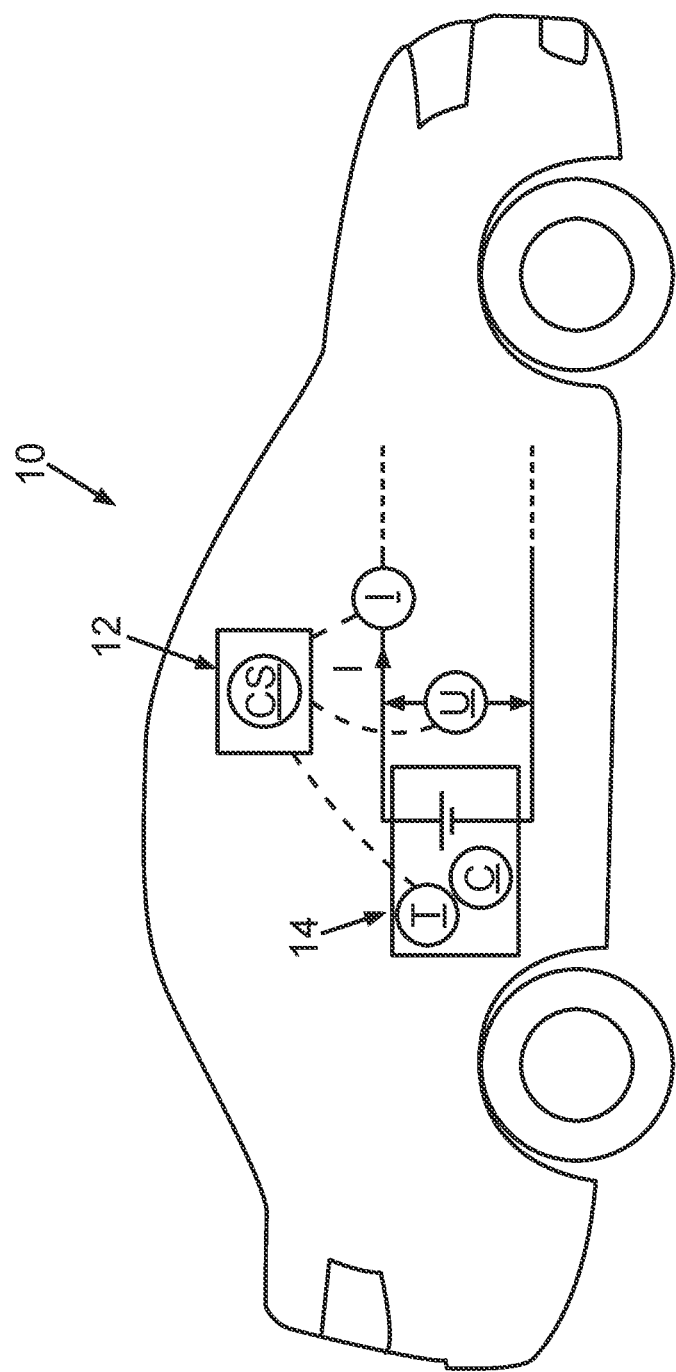
FIG. 1 shows a schematic representation of a motor vehicle with a monitoring device according to an exemplary embodiment of the invention.

The exemplary embodiments outlined below are preferred embodiments of the invention. In the exemplary embodiments the components of the embodiment described each represent individual features of the invention which are to be considered independently of one another and which further develop the invention, in each case independently of one another. Therefore, the disclosure is intended to comprise other than the illustrated combinations of the features of the embodiments. Furthermore, the described embodiments can be supplemented by additional ones of the already described features of the invention.

In the figures, the same reference numerals designate functionally identical elements.

FIG. 1 shows a schematic representation of a motor vehicle 10 with a monitoring device 12 for monitoring a status of a battery 14 according to an exemplary embodiment of the invention. For monitoring the status of battery 14, which may be designed in particular as a high-voltage battery, monitoring device 12 detects, in particular during a load phase of battery 14, in which battery 14 is supplied with energy and/or in which energy is removed from battery 14, the battery current I flowing in or out of battery 14. Monitoring device 12 determines an estimated value CS for the capacity of battery 14 as a function of the battery current I. For the calculation of this estimated value CS monitoring device 12 can optionally also detect further battery variables, for example the battery voltage U and/or the battery temperature T, as will now be explained in greater detail in connection with FIG. 2 to FIG. 4.

Figure 2:
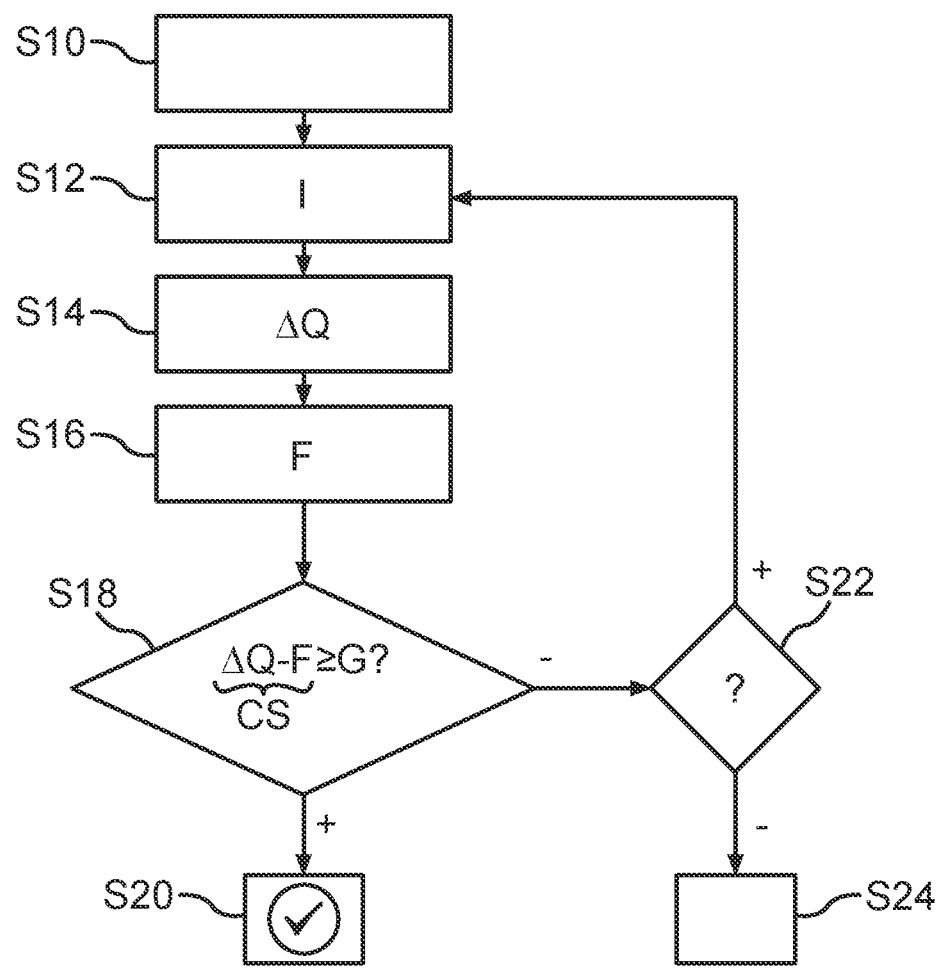
FIG. 2 shows a flow chart illustrating a method for monitoring a status of a battery according to an exemplary embodiment of the invention.

FIG. 2 shows a flow chart illustrating a method for monitoring a status of a battery 14 according to an exemplary embodiment of the invention. In this example, a load phase of battery 14 starts in step S10. For example, a driving operation of motor vehicle 10 is started or a charging operation for charging battery 14 starts. Furthermore, in step S12, the battery current I is continuously detected during the load phase. Preferably, the detection of the battery current I starts in step S12 as soon as the beginning of the load phase of battery 14 starts. By integration of battery current I, the amount of charge ΔQ supplied to and/or removed from battery 14 can be determined in step S14. In particular, battery current I can be continuously integrated for this purpose, in particular also taking into account a change in the current direction by a corresponding sign in the integration. This can occur, for example, when during the driving operation energy is not only removed from battery 14, but said battery is recharged at times, for example, by recuperation or in the presence of an additional internal combustion engine. This ultimately results in the net charge difference $\Delta Q$ from the integration of the current. In addition, a maximum possible measurement error F can also be determined in step S16. In particular, in this example, this maximum measurement error F represents the maximum error possible in the integration of the current, which can be assumed to be 1 percent of the charge throughput.

Furthermore, it is checked in step S18 whether the determined amount of charge $\Delta Q$ exceeds a predetermined limit value G taking into account the integration error F. In this example, the charge difference $\Delta Q$ less the maximum error F forms the estimated value CS for the capacity C of battery 14, especially in this example, an estimated value CS for the minimum capacity. In other words, if a certain amount of charge $\Delta Q$ is removed from battery 14, battery 14 must also have a corresponding minimum capacity for receiving this removed amount of charge $\Delta Q$. The same applies when the amount of charge $\Delta Q$ is supplied to the battery, in particular always taking into account the integration error F. During the load phase of battery 14, that is to say, for example, when driving or charging battery 14, the effective amount of charge $\Delta Q$ and its associated error F can be continuously calculated and thereby it can be constantly checked whether the predetermined limit G is exceeded. If this is the case, a positive diagnosis result is immediately output in step S20, which states that the capacity C of battery 14 is above the specifiable limit value G. However, as long as the limit value G has not yet been exceeded, it can be checked in step S22 whether the load state of battery 14, that is the charging or the driving operation of motor vehicle 10, still continues. If so, the battery current I continues to be detected and the amount of charge $\Delta Q$ is further determined by integration of the battery current I and its associated error F until either the predetermined limit value G is exceeded in step S18 and the positive diagnosis result is output in step S20, or it is determined in step S22 that now the driving or charging, or in general the load phase of battery 14, is completed and that the current flow is equal to 0. In this case, the diagnosis remains without result, which is illustrated by step S24.

Figure 3:
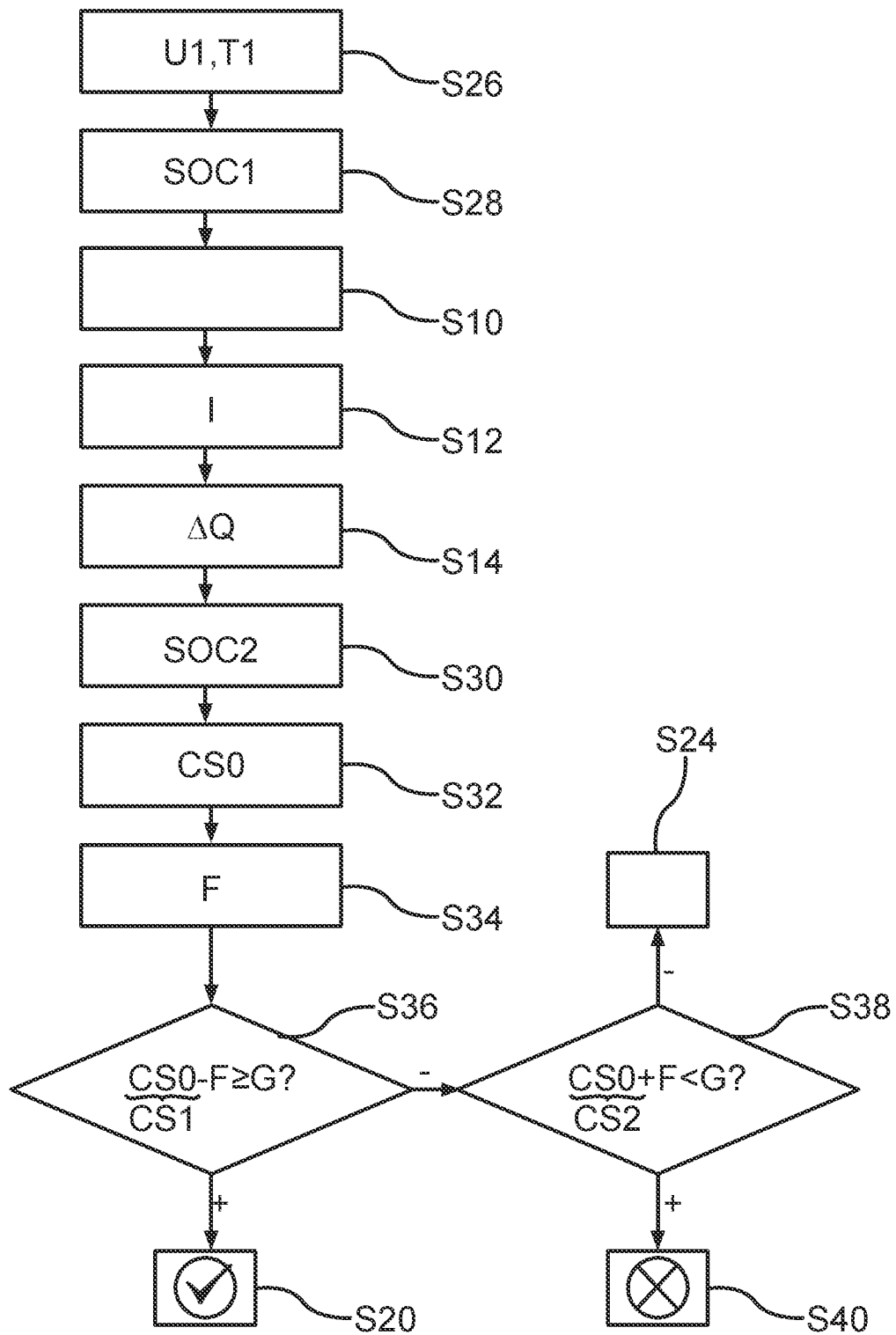
FIG. 3 shows a flow chart illustrating a method for monitoring a status of a battery according to another exemplary embodiment of the invention.

A further advantageous embodiment of the invention is shown in FIG. 3 in the form of another flow chart. Here, first, in an unloaded state of battery 14, preferably in the relaxed state of battery 14, a no-load voltage U1 of battery 14 and its temperature T1 are detected in step S26 and in step S28 an initial state of charge SOC1 is determined based on a look-up table. This is followed again by steps S10, S12 and S14, as already described in connection with FIG. 2. Thus, in step S10, a load phase of battery 14 begins, whereupon the battery current is detected in step S12 and, by its temporal integration, the effective amount of charge $\Delta Q$ which is supplied to or removed from battery 14 is determined in step S14. After completion of the load phase of battery 14, the final state of chare SOC2 of battery 14 is determined in step S30. However, the determination of this final state of charge SOC2 is not based on the measurement of the open circuit voltage of battery 14, but instead is based on the current measurement in step S12. The capacity of battery 14 also is included in the determination of the final state of charge SOC2 on the basis of the current measurement. As an approximation, the last determined capacity value or capacity estimate can be used for this purpose. However, this previous determined capacity value does not necessarily have to be the last capacity value determined in terms of time, but it is also possible to select the capacity value from a plurality of capacity values within a predetermined, preceding time period which could be determined with the greatest accuracy. For example, this capacity value may also have been determined by another conventional method, for example on the basis of the open circuit voltages that were detected in the relaxed state of battery 14, whereby the capacity of battery 14 can be calculated with particularly high accuracy. Based on this, the final state of charge SOC2 of battery 14 can now be determined in step S30, and on the basis of the parameters determined in this way, an estimated value CS0 for the capacity C of battery 14 can be determined according to the following formula:

$$CS0 = \frac{\left|\int I(t)dt\right|}{|SOC1 - SOC2|} = \frac{\Delta Q}{|SOC1 - SOC2|}$$

For the estimated value CS0 of the capacity C of battery 14 thus determined in step S32, a corresponding error, in particular a maximum possible error F, can now likewise be determined in step S34. This maximum possible error F can, in turn, take into account the error in the integration of the current, as well as, optionally, further errors, for example based on the accuracy of the previous capacity estimate used for the final state of charge SOC2. Subsequently, it can be checked again in Step S36 whether the determined capacity estimate CS0 minus the determined error F is greater than or equal to the specifiable limit value G. Here, the determined estimated value CS0 minus the error F can also be combined as total estimate CS1 for the minimum capacity of battery 14. If this estimated value CS1 is greater than or equal to the predetermined limit value G, a positive diagnosis result is again output in step S20. Otherwise, it is checked in step S38 whether the capacity estimate CS0 determined on the basis of the above equation plus the maximum possible error F, which again can be summarized as the total estimate CS2 for the maximum capacity C of battery 14, is smaller than the predetermined limit value G. If this is the case, a negative diagnosis result is output in step S40, and if not, no diagnosis result is output, which is again illustrated by step S24. Thus, not only can it be checked in this way whether the total capacity C of battery 14 is above the predetermined limit value G, but it can also be checked whether the total capacity C of battery 14 is below this limit value G. By this advantageous embodiment of the invention also, a diagnosis of battery 14 is possible, in particular an estimate of its capacity C, without having to accept long waiting times until the relaxation time of battery 14 has elapsed, which can usually save about one hour and thus a much faster diagnosis as well as a successful diagnosis with a higher probability is made possible.

Figure 4:
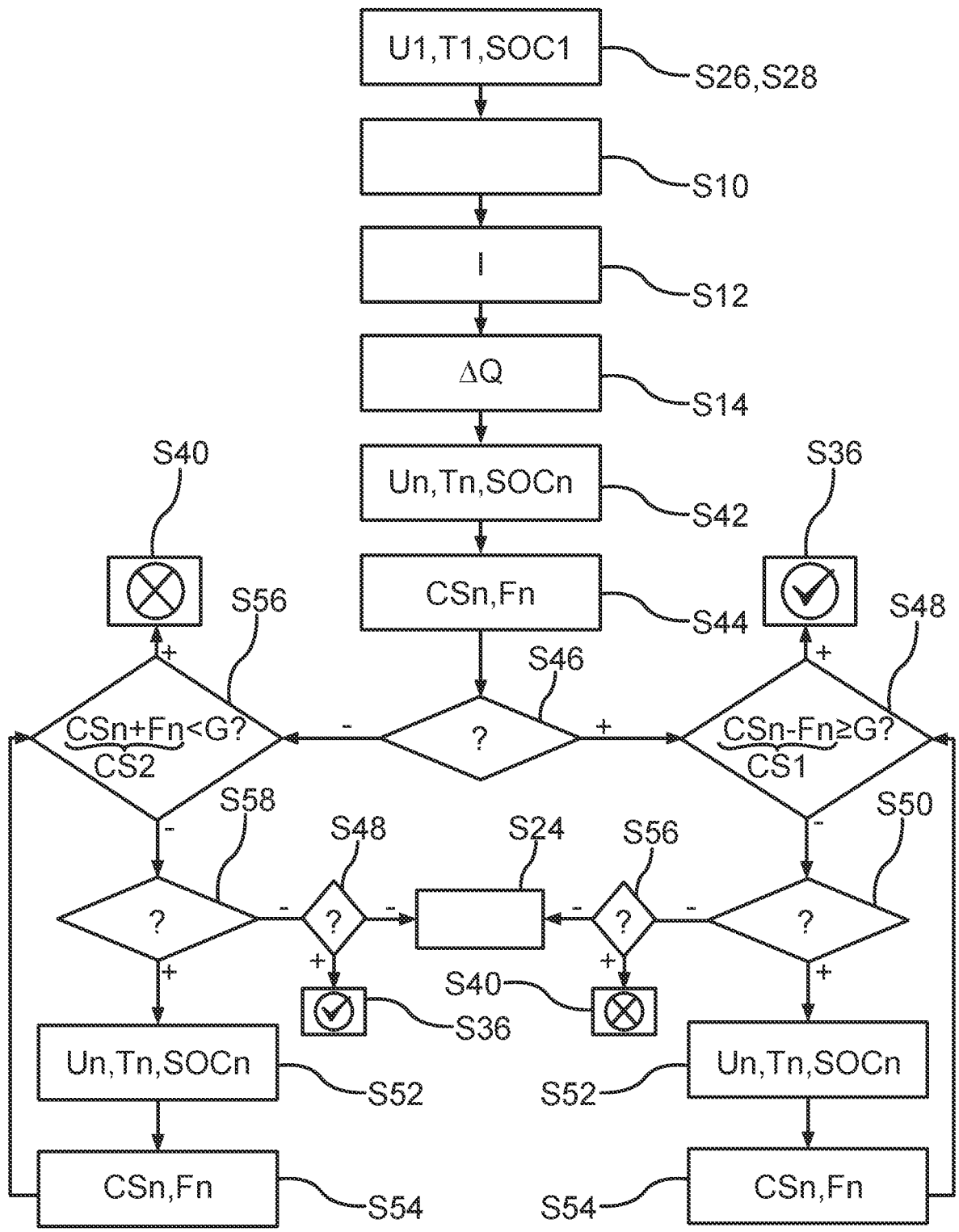
FIG. 4 shows a flow chart illustrating a method for monitoring a status of a battery according to another exemplary embodiment of the invention.

FIG. 4 shows a flow chart for illustrating a method according to another exemplary embodiment of the invention. This method starts like the method described with reference to FIG. 3. First, the no-load voltage U1, the temperature T1 and from these on the basis of a look-up table the initial state of charge SOC1 of battery 14 is determined in step S26 in the unloaded state of battery 14, preferably in the relaxed state of battery 14. Subsequently, in step S10, a load phase of battery 14 begins, whereupon the battery current I again is detected in step S12 and from this battery current the amount of charge $\Delta Q$ removed from or supplied to battery 14 is determined in step S14. At the end of the load phase and within the relaxation time of battery 14 the no-load voltage Un and the associated battery temperatures Tn are then repeatedly determined in step S42, and based thereon respective final states of charge SOCn of battery 14 are determined. From these determined variables, in turn, respective estimated values CSn can be determined in step S44, in particular according to the following formula $$CSn = \frac{\left|\int I(t)dt\right|}{|SOC1 - SOCn|} = \frac{\Delta Q}{|SOC1 - SOCn|}$$

as well as associated maximum possible errors Fn. On the basis of the time course of the determined capacity estimates CSn, it is determined in step S46 whether the capacity C of battery 14 increases or decreases over time during the relaxation time. This is determined based on whether the determined estimated values CSn increase or decrease over time. If these estimated values increase over time, it is checked in step S48 whether one of these determined estimated values CSn minus the corresponding error Fn, which again can be summarized as a minimum estimate CS1 of the capacity C of battery 14, is greater than the predetermined limit value G. Since the capacity values CSn increase over time, it is sufficient to prove for one of these capacity values CSn, preferably the most recently determined one, that this value minus the associated error Fn is greater than this limit value, because, due to the increase of capacity C during the relaxation time, a final capacity value C will be reached which is greater than all previous capacity values. If at least one of these estimated values CS1 is greater than or at least equal to this limit value G, a positive diagnosis is again output in step S36. Otherwise, it is checked in step S50 whether battery 14 is already relaxed. If this is not the case, then in step S52 at least one further no-load voltage value Un and the associated temperature Tn are detected and from these, again, another final state of charge value SOCn of battery 14 is determined, in step S54 again a corresponding estimated value CSn with associated maximum possible errors Fn and again checked in step S48 whether now this newly determined estimated value CSn minus the corresponding error Fn is above the predetermined limit G. This is done until a positive diagnosis can be made in step S36 or battery 14 is already relaxed. If this is the case, it is checked in step S56 whether the most recently determined estimated value CSn plus the maximum possible error Fn is smaller than the limit value G, and if so, a negative diagnosis result is output in step S40, and if not, no diagnosis result is output in step S24.

If, on the other hand, it is determined in step S46 that the capacity C of battery 14 decreases in the course of the relaxation time, it is checked in step S56 whether one of the determined capacity estimates CSn plus the associated maximum possible error Fn is smaller than the predetermined limit value G. Here also, again, a respective capacity estimate CSn plus its maximum possible error Fn can be summarized to a total maximum estimated value CS2. If this is now below the predetermined limit value G, a negative diagnosis result is output in step S40. Otherwise, it is again checked here in step S58 whether battery 14 is already relaxed and if this is not the case, in step S52 at least one other value of the no-load voltage Un with the associated temperature Tn of battery 14 is again detected and from this a current final state of charge SOCn in turn, according to the above formula, a corresponding current capacity estimate CSn with associated error Fn is determined in step S54. Then, the method continues again to step S56. This is also carried out until either a negative diagnosis result is output in step S40 or it is determined in step S58 that battery 14 is now relaxed. In this case, it is again checked in step S48 whether the most recently determined capacity estimate CSn less the associated error Fn is greater than or equal to the predetermined limit value G. If this is the case, a positive diagnosis result is output in step S36. Otherwise, again, no diagnosis is output in step S24.

Also by this advantageous method, the probability can be significantly increased that a successful diagnosis result can be output, be it a positive or negative result, before the relaxation time of battery 14 has elapsed.

In addition, the method can also be accelerated, in particular if none of the queries in step S48 and S56 can be responded to affirmatively, by temporally extrapolating the previously determined estimated values CSn in order to estimate the likely final value of the capacity C of battery 14 on the basis of this extrapolation. This final estimated value can then also be compared taking into account its associated error with the limit value G, and depending on whether it is above the limit value G, a positive diagnosis result can be output, or if it is below, correspondingly a negative diagnosis result can be output. This also advantageously makes it possible, on average, to shorten the time to the output of a successful diagnosis result.

Thus it is possible that the capacity of the cell during the relaxation is continuously calculated or estimated. If the calculated or estimated capacity is above the minimum threshold G already at the beginning of the relaxation and increases in the course of the relaxation or exceeds the minimum threshold G, a positive diagnosis result can be output immediately. If the capacity decreases in the course of the relaxation, the trend or the slope can be used to predict whether there is a risk that the minimum threshold G will be cracked, that is, undershot. If this can be safely ruled out, a positive diagnosis result can also be output.

Overall, the examples show how the frequency of a successful diagnosis of the battery can be significantly increased by the invention and, in particular, can be detected much more frequently if there is no error. This allows the battery to be monitored much more reliably and thus more security is provided overall.

The invention claimed is:

1. A method for monitoring a status of a battery, comprising: detecting, during a measuring cycle, a battery current (I) and the amount of charge (AQ) which was supplied to the battery and/or removed from the battery during the measuring cycle is determined as a function of the detected battery current (I), and at least one parameter of the battery is determined as a function of the determined amount of charge (AQ), wherein an estimated value for a capacity (C) of the battery before a certain relaxation time of the battery has elapsed, during which the battery is in the unloaded state after a load phase during which power is supplied to the battery and/or power is removed from the battery, is determined as one of the at least one parameters, and as a function of the estimated value (CS) for the capacity (C) it is determined whether the capacity (C) of the battery is above a specifiable limit value (G) wherein the estimated value (CS) is determined as a ratio of the determined amount of charge (AQ) to an absolute value of a change in a state of charge of the battery, and wherein as a function of a total charge throughout during the measurement cycle, a maximum measurement error (F) is found for the determined amount of charge (AQ), wherein the maximum measurement error (F) is taken into account when determining the estimated value (CS), in particular wherein the estimated value (CS) represents the determined amount of charge (AQ) less the maximum measurement error (F).

2. The method according to claim 1, wherein the amount of charge (AQ) supplied to the battery and/or removed from the battery during the measurement cycle represents the estimated value (CS) for the capacity (C).

3. The method according to claim 1, wherein the amount of charge (AQ) supplied to the battery and/or removed from the battery during the measurement cycle is determined by means of a temporal integration of the battery current (I).

4. The method according to claim 1, wherein for determining the state of charge change, an initial state of charge (SOC1) of the battery at the beginning of the measurement cycle is determined as a function of a voltage measurement of the battery voltage (U1) while the battery is in the unloaded state.

5. The method according to claim 1, wherein for determining the state of charge change, a final state of charge (SOC2) at the end of the measurement cycle is determined as a function of the detected battery current (I) and as a function of a capacity value of the battery which was determined in a preceding measurement cycle.

6. The method according to claim 1, wherein at the end of the measurement cycle a plurality of second battery voltages (Un) are determined in temporal succession, while the battery is in the unloaded state, wherein, as a function of the second battery voltages (Un), respective second discharge state values (SOCn) are determined, as a function of which respective capacity values (CSn) are determined, and wherein in the event that the capacity values (CSn) increase over time and the temporally first capacity value (CSn) is greater than the specifiable limit value (G), it is determined that the capacity (C) of the battery is above the limit value (G); in the event that the capacity values (CSn) decrease over time and the temporally first capacity value (CSn) is smaller than the specifiable limit value (G), it is determined that the capacity (C) of the battery is below the limit value (G); in the event that the capacity values (CSn) increase over time and the temporally first capacity value (CSn) is smaller than the specifiable limit value (G), or in the event that the capacity values (CSn) decrease over time and the temporally first capacity value is greater than the specifiable limit value (G), the capacity values (CSn) are extrapolated over time, and the estimated value (CS) is determined as a function of the extrapolation.

7. A monitoring device for monitoring a status of a battery, wherein the monitoring device is designed to detect a battery current (I) during a measurement cycle and, as a function of the detected battery current (I), to determine the amount of charge (AQ) supplied to the battery and/or removed from the battery during the measurement cycle, and, as a function of the determined amount of charge (AQ), to determine at least one parameter of the battery, wherein the monitoring device is configured in such a way that the monitoring device determines an estimated value (CS) for a capacity (C) of the battery before a certain relaxation time of the battery has elapsed, during which the battery is in the unloaded state after a load phase during which power is supplied to the battery and/or power is removed from the battery, as a parameter, and, as a function of the estimated value (CS), determines for the capacity (C) whether the capacity (C) of the battery is above a specifiable limit value (G), wherein the estimated value (CS) is determined as a ratio of the determined amount of charge (AQ) to an absolute value of a change in a state of charge of the battery, wherein as a function of a total charge throughput during the measurement cycle, a maximum measurement error (F) is found for the determined amount of charge (AQ), wherein the maximum measurement error (F) is taken into account when determining the estimated value (CS), in particular wherein the estimated value (CS) represents the determined amount of charge (AQ) less the maximum measurement error (F).

8. The method according to claim 2, wherein the amount of charge (AQ) supplied to the battery and/or removed from the battery during the measurement cycle is determined by means of a temporal integration of the battery current (I).

9. The method according to claim 4, wherein for determining the state of charge change, a final state of charge (SOC2) at the end of the measurement cycle is determined as a function of the detected battery current (I) and as a function of a capacity value of the battery which was determined in a preceding measurement cycle.

10. The method according to claim 3, wherein at the end of the measurement cycle a plurality of second battery voltages (Un) are determined in temporal succession, while the battery is in the unloaded state, wherein, as a function of the second battery voltages (Un), respective second discharge state values (SOCn) are determined, as a function of which respective capacity values (CSn) are determined, and wherein in the event that the capacity values (CSn) increase over time and the temporally first capacity value (CSn) is greater than the specifiable limit value (G), it is determined that the capacity (C) of the battery is above the limit value (G); in the event that the capacity values (CSn) decrease over time and the temporally first capacity value (CSn) is smaller than the specifiable limit value (G), it is determined that the capacity (C) of the battery is below the limit value (G); in the event that the capacity values (CSn) increase over time and the temporally first capacity value (CSn) is smaller than the specifiable limit value (G), or in the event that the capacity values (CSn) decrease over time and the temporally first capacity value is greater than the specifiable limit value (G), the capacity values (CSn) are extrapolated over time, and the estimated value (CS) is determined as a function of the extrapolation.

11. The method according to claim 4, wherein at the end of the measurement cycle a plurality of second battery voltages (Un) are determined in temporal succession, while the battery is in the unloaded state, wherein, as a function of the second battery voltages (Un), respective second discharge state values (SOCn) are determined, as a function of which respective capacity values (CSn) are determined, and wherein in the event that the capacity values (CSn) increase over time and the temporally first capacity value (CSn) is greater than the specifiable limit value (C), it is determined that the capacity (C) of the battery is above the limit value (G); in the event that the capacity values (CSn) decrease over time and the temporally first capacity value (CSn) is smaller than the specifiable limit value (G), it is determined that the capacity (C) of the battery is below the limit value (G); in the event that the capacity values (CSn) increase over time and the temporally first capacity value (CSn) is smaller than the specifiable limit value (G), or in the event that the capacity values (CSn) decrease over time and the temporally first capacity value is greater than the specifiable limit value (G), the capacity values (CSn) are extrapolated over time, and the estimated value (CS) is determined as a function of the extrapolation.

* * * * *